United States Patent [19]
Graef

[11] Patent Number: 5,831,993
[45] Date of Patent: Nov. 3, 1998

[54] METHOD AND APPARATUS FOR SCAN CHAIN WITH REDUCED DELAY PENALTY

[75] Inventor: Stefan Graef, Milpitas, Calif.

[73] Assignee: LSI Logic Corporation, Milpitas, Calif.

[21] Appl. No.: 819,856

[22] Filed: Mar. 17, 1997

[51] Int. Cl.$^6$ .................................................. G06F 11/00
[52] U.S. Cl. ........................................................ 371/22.32
[58] Field of Search .............................. 371/22.32, 22.1, 371/22.2, 22.5; 395/183.06

[56] References Cited

U.S. PATENT DOCUMENTS 5,640,404  6/1997  Satish ......................................... 371/22
5,694,402  12/1997  Butler et al. ............................. 371/22

Primary Examiner—Vincent P. Canney
Attorney, Agent, or Firm—Fitch, Even, Tabin & Flannery

[57] ABSTRACT

A method is provided for operating a scan chain in a semiconductor device having a plurality of serially connected logic blocks, an output from a first logic block being coupled to an input of a first latch, the output from the first latch being coupled to the input of a second logic block, an output of the second logic block being coupled to an input of a second latch, the method comprising: detecting a test enable signal; if the test enable signal is active: detecting the output of the first latch, and setting the output of the second latch to the same state as the detected output of the first latch, independently of the state of the output of the second logic block; if the test enable signal is inactive: setting the output of the second latch responsive to the output of the second logic block.

12 Claims, 4 Drawing Sheets

5,831,993

METHOD AND APPARATUS FOR SCAN CHAIN WITH REDUCED DELAY PENALTY

TECHNICAL FIELD

The present invention relates generally to the field of logic circuits, and more particularly, to a method and apparatus relating to scan chains useful in testing semiconductor circuits. Still more particularly, the present invention relates to an improved scan chain which avoids the delay penalty caused by multiplexers located in the signal path.

BACKGROUND OF THE INVENTION

As semiconductor circuits become increasingly complex, the need for fast and accurate test methods becomes ever more important. One approach to testing semiconductor circuits is commonly referred to as "design for testability" ("DFT") and, as the name implies, involves including test circuits in the overall design of the chip. When the chip is fabricated, the test circuits may be accessed through various methods, such as wafer probing, and will cause the chip to perform various functions which serve to indicate whether the various circuits on the chip are operating properly.

One popular method for implementing design for testability involves providing a scan chain on the chip which allows selected circuits on the chip to be provided with known input data. The resulting output data from the circuits is then passed to a test point on the chip. Various types of scan based techniques are generally known in the art, see, e.g., Weste, "Principles of CMOS VLSI Design," Addison-Wesley (1992). One specific scan based technique involves creating a serial scan chain on the chip and is illustrated in FIG. 1.

FIG. 1 is a block diagram showing a serial scan chain having two stages 1 and 2. Stage 1 includes logic block 100, multiplexer 102, and register, or latch 110. Similarly, stage 2 includes logic block 112, multiplexer 114 and latch 122. The output of the scan chain is eventually passed to test point 124 where data from the scan chain is observed during testing. Test point 124 can be any convenient structure to enable access during testing, such as a bond pad or a metal area suitable for probing according to techniques known in the art. The inputs to stage 1 can be provided by additional stages of the scan chain, or from any other logic or port on the chip.

The scan chain will be described further with respect to stage 2, it being understood the operation of stage 1 is substantially similar. Logic block 112 contains functional circuitry for which testing is desired. Such logic is, of course, a matter of design choice. Multiplexer 114 is a conventional 2-1 multiplexer having inputs 116 and 118, and select line 120. Select line 120 is driven by Test Enable signal TE which is generated by other logic on the chip (not shown). The Test Enable signal TE is used to control the mode of operation of the scan chain. The scan chain is said to be in "test mode" when the Test Enable signal TE is asserted. If the Test Enable signal TE is unasserted, the scan chain is said to be in "normal" mode.

In test mode, the signal received at input 116, which is coupled to the output of latch 110 and, hence, stage 1, is passed to the input of latch 122. By contrast, in normal mode the signal received from the output of logic block 112 at input 118 of multiplexer 114 is passed to the input of latch 122. Latch 122 is operated by clock signal CLK. On each edge of CLK, the data present at the input of latch 122 is passed to its output. The state of the output is then maintained until a subsequent CLK edge is received.

By properly operating the Test Enable signal TE in conjunction with clock signal CLK, it is possible to input known data into the logic blocks 100 and 112 and to pass the output of the logic blocks to test point 124 for observation. For example, it is assumed that logic block 100 has performed an operation, and now its output data is to be observed at test point 124 to determine whether the result is correct. In this case, the Test Enable signal TE is first unasserted. This causes multiplexer 102 to pass the output of logic block 100 to the input of latch 110. The data present on input 104 is unused. On the next edge of clock signal CLK, the output data of logic block 100 is latched at the output of latch 110.

The Test Enable signal TE is now asserted. This causes multiplexer 114 to select the data present at input 116 which, of course, is the previous cycle output of logic block 100 that is presently latched at the output of latch 110, to be passed to the input of latch 122. Although logic block 112 evaluates this data and provides the result to input 118 of multiplexer 114, this result data is ignored. On the following edge of clock signal CLK, the data from input 116 is then latched at the output of latch 122, which is coupled to test point 124. In this way, the data from logic block 100 is passed to test point 124 without interference by logic 112.

In another example, it is possible to provide a given logic block in the scan chain with a known input value and record its response. For example, it is assumed that it is desired to test the response of logic block 112 to a high, or logical 1, data value. In this case, input line IN is driven high by appropriate logic located elsewhere on the chip. The Test Enable signal TE is then driven high which causes the high signal at input 104 of multiplexer 102 to be passed to latch 110. The data present at the output of logic block 100 is ignored. On the following edge of clock signal CLK, the output of latch 110 will be latched high and provided to the input of logic block 112. After evaluation, the resulting output of logic block 112 is then passed to input 118 of multiplexer 114. The Test Enable signal TE is then unasserted causing the data on input 118 to be passed to latch 122, latched on the next edge of clock signal CLK, and thus provided to test point 124.

Although useful, the circuit shown in FIG. 1 suffers from a number of disadvantages. For example, multiplexers must be provided throughout the signal path of the scan chain. Each multiplexer adds a small, but often significant, delay to the scan chain. In high speed circuits where the timing requirements are very tight, it is possible that a delay from the multiplexers can result in a "speed fault" which causes improper operation of the circuitry, even though the logical design is entirely correct. It is thus one object of the invention to provide an improved method and apparatus useful in scan chain circuits which overcomes this problem. Still further improvements and advantages will become apparent in view of the following disclosure.

SUMMARY OF THE INVENTION

One aspect of the invention relates to a method for operating a scan chain in a semiconductor device having a plurality of serially connected logic blocks, an output from a first logic block being coupled to an input of a first latch, the output from the first latch being coupled to the input of a second logic block, and an output of the second logic block being coupled to an input of a second latch. In one embodiment, the method comprises the steps of detecting a Test Enable signal; detecting the output of the first latch, and setting the output of the second latch to the same state as the detected output of the first latch, independently of the state of the output of the second logic block, if the Test Enable signal is asserted; and setting the output of the second latch responsive to the output of the second logic block if Test Enable signal is unasserted.

Another aspect of the invention relates to an apparatus for operating a scan chain having a plurality of serially connected logic blocks, an output from a first logic block being coupled to an input of a first latch, the output from the first latch being coupled to the input of a second logic block, and an output of the second logic block being coupled to an input of a second latch. In one embodiment, the apparatus comprises a means for detecting a Test Enable signal; means for detecting the output of the first latch; means for setting the output of the second latch to the same state as the detected output of the first latch, independently of the state of the output of the second logic block, if the Test Enable signal is asserted; and means for setting the output of the second latch responsive to the output of the second logic block if the Test Enable signal is not asserted.

A further aspect of the invention relates to a semiconductor device having a scan chain useful to output test data from a plurality of serially connected logic blocks. In one embodiment, the scan chain comprises a first logic block having an output coupled to an input of a first latch; a second logic block having an output coupled to an input of a second latch and an input coupled to an output of the first latch; and a latch control element having an input for detecting a Test Enable signal, an input for detecting the output of the first latch, and an output for setting an output of the second latch; wherein the latch control element sets the output of the second latch to the same state as the detected output of the first latch if the Test Enable signal is asserted.

BRIEF DESCRIPTION OF EMBODIMENTS OF THE INVENTION

Figure 2:
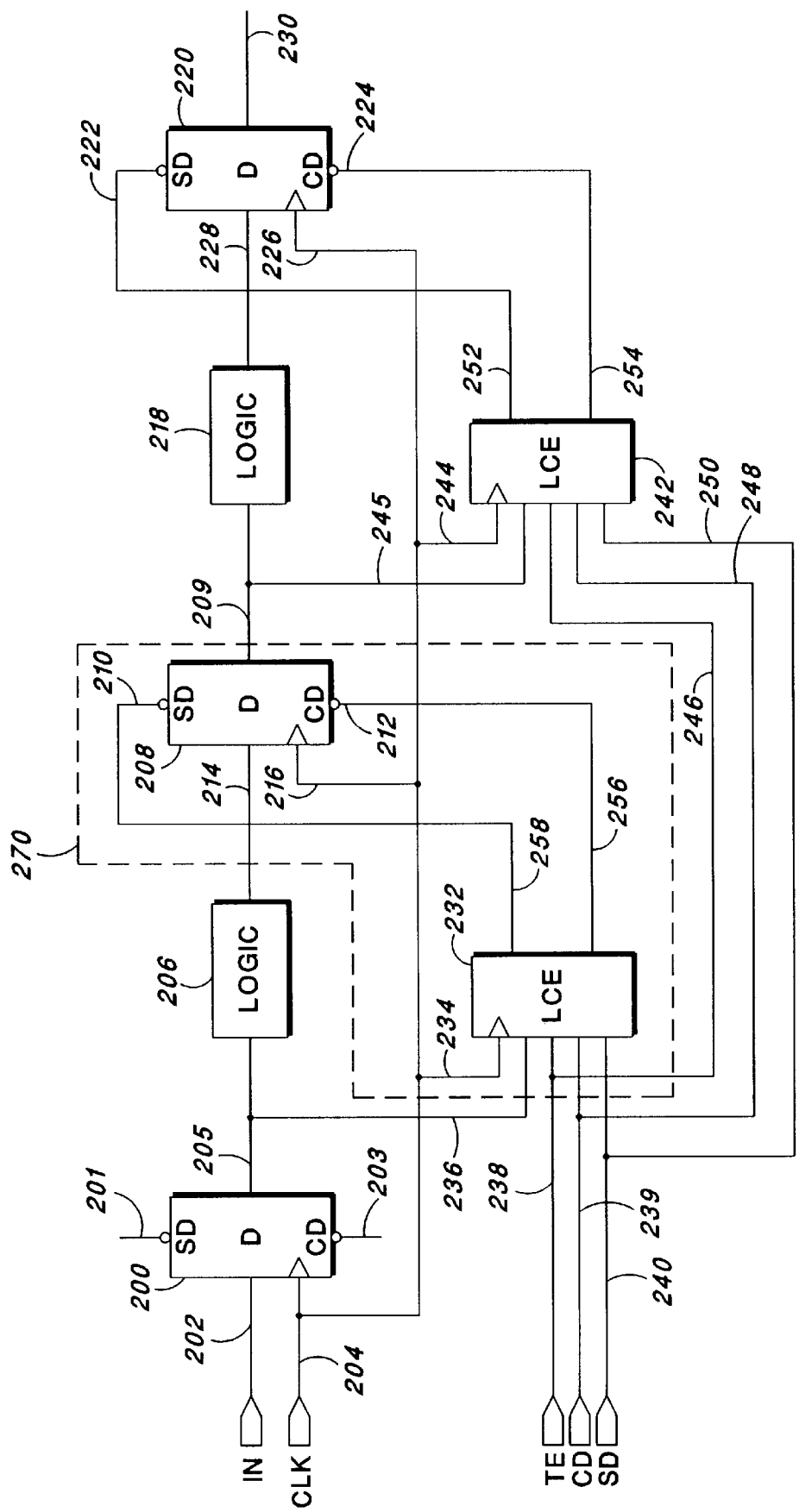
FIG. 2 is a block diagram of a scan chain according to an embodiment of the invention.

Referring now to FIG. 2, there is shown a block diagram of a scan chain according to one embodiment of the invention. In this embodiment, the scan chain comprises a plurality of logic blocks 206 and 218 which are serially coupled with latches 200, 208 and 220. In the particular embodiment shown, latches 200, 208 and 220 are conventional "D latches" which are clocked by clock signal CLK received by each latch at inputs 204, 216 and 226, respectively. Of course, it will be recognized that other conventional latches or registers could be substituted for the D latches illustrated, such as RS or JK latches.

In the present embodiment, each latch is provided with a Set Direct ("SD") input 201, 210 and 222, and a Clear Direct ("CD") input 203, 212 and 224, respectively. Each latch is also provided with a data input, 202, 214 and 228, respectively, which receives input data from external logic, or logic blocks 206 and 218. Latches 200, 208 and 220 operate such that signals asserted on the SD and CD inputs cause the output of the latch to be set to a corresponding logic state, regardless of the signal present at the latches data input. This is described in greater detail with respect to latch 200.

Latch 200 is provided with Set Direct input 201 and Clear Direct input 203. The Set Direct and Clear Direct signals received at inputs 201 and 203 are active low, i.e., they are asserted when their voltage level is low, or logical 0. Suitable logic for generating the Set Direct and Clear Direct signals will be described in greater detail herein. However, for present purposes it is sufficient to note that these signals could be provided by the external Set Direct and Clear Direct signals provided to latch control elements 232 and 242 by logic located external to the scan chain, or such signals could be provided from additional latch control elements in additional stages of the scan chain illustrated. In any case, when Set Direct is asserted, output 205 is pulled high. Conversely, when Clear Direct is asserted, output 205 is pulled low. Output 205 will respond in this fashion regardless of the data present at data input 202. When neither Set Direct nor Clear Direct are asserted, then the data present at data input 202 is latched at output 205 when a clock edge is received at clock input 204. Latches 208 and 220 operate in substantially the same way as latch 200.

Latch control elements 232 and 242 are provided to control the operation of latches 208 and 220. In the illustrated embodiment, latch control element 232 receives clock signal CLK at input 234. Output 205 of latch 200 is provided to latch control element 232 at input 236. Latch control element 232 also has inputs 238, 239 and 240 for receiving external signals Test Enable TE, Clear Direct CD and Set Direct SD, respectively. Conventionally, the Set Direct and Clear Direct signals are provided by other logic on the chip which is required to operate the latches in the scan chain for various test purposes. Similarly, the Test Enable signal TE is generated by appropriate logic which allows the scan chain to be placed in and out of test mode to perform the desired tests. The logic for generating Test Enable TE, Clear Direct CD and Set Direct SD, as well as the operation of the signals themselves, is conventional and will not be described further herein except as it relates to the operation of the scan chain.

Latch control element 232 also has outputs 256 and 258 which are coupled to the Set Direct 210 and Clear Direct 212 inputs of latch 208, respectively.

Latch control element 242 is substantially similar to latch control element 232. In this case, latch control element 242 receives clock signal CLK at input 244, the output 209 of latch 208 at input 245, and the Test Enable, Clear Direct and Set Direct signals at inputs 246, 248 and 250, respectively. Outputs 252 and 254 control Set Direct input 222 and Clear Direct input 224 of latch 220.

Figure 1:
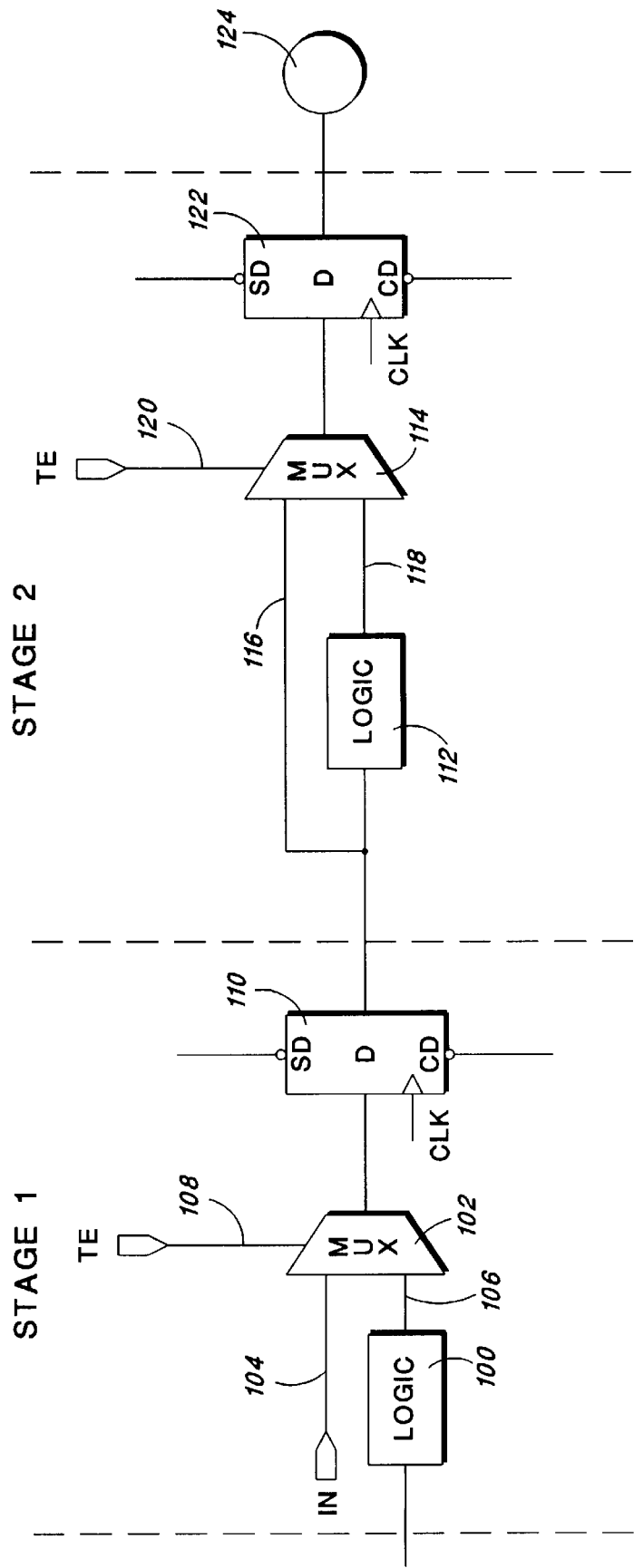
FIG. 1 is block diagram of a conventional scan chain.

As is apparent from the figure, the embodiment shown in FIG. 2 has no multiplexers in the signal path between the logic blocks. Thus, for example, a signal received on signal line IN can be clocked through the circuit to test point 230 without suffering from multiplexer delays of the circuit shown in FIG. 1. Further, it will be clear to those of skill in the art that any number of logic stages can be provided in accordance with the present invention. In operation, the circuit also permits testing of any and all logic blocks in the scan chain as will be described in greater detail herein.

In one example, it is assumed that the output of logic block 206 is to be passed to test point 230 without being operated on by logic block 218. The output of logic block 206 is coupled to input 214 of latch 208. The scan chain is placed in normal mode by not asserting Test Enable signal TE. Therefore, on the first edge of clock signal CLK after logic block 206 has evaluated, the data received from logic block 206 is latched at output 209 of latch 208. The state of output 209 of latch 208 is detected, or read, at input 245 of latch control element 242. Next, Test Enable signal TE is asserted and detected at input 246 of latch control element 242, thereby placing the scan chain in test mode. Thus, on the next edge of clock signal CLK, latch control element 242 will assert one of outputs 252 or 254, depending on the state of data input 245. In test mode, the global, or external, Set Direct SD and Clear Direct CD signals, received at inputs 246 and 248, respectively, are ignored by latch control element 242.

As stated above, latch control element 242 then asserts either output 252 or 254 depending on the state of input 245. For example, it is seen from the figure that the Set Direct and Clear Direct inputs of the latches are active, or asserted, low. Thus, if the output of latch 210 is high, then latch control element 242 will pull output 254 low to assert a Set Direct signal at input 222 of latch 220. This causes the output of latch 220 to go high, regardless of the output of logic block 218 which is present on input 228 of logic block 220. This signal is then, of course, observed at test point 230. In other words, latch control element 242 operates to cause the output from latch 210 to be reflected, in the next clock cycle, at the output of latch 220, regardless of the output of logic block 218.

In another example, it is assumed that it is desired to pass a signal representing a logical 1 to logic block 218, and then, pass the output from logic block 218 to test point 230 for observation. In this case, input signal IN is driven high by suitable conventional logic (not shown). This high signal is then latched at output 205 of latch 200 on the subsequent edge of signal CLK. Here, the Set Direct and Clear Direct inputs 201 and 203 of latch 200 are operated by other suitable logic such as the external Set Direct and Clear Direct generating logic, or another logic control element located upstream of latch control elements 232 and 242. In any case, the circuit is then placed in test mode by asserting Test Enable signal TE at input 238 of logic control element 232. Since the output of latch 200 is high, logic control element 232 asserts output 256 low. This, in turn, causes output 209 of latch 210 to go high, regardless of the input present at input 214. This data is then evaluated by logic block 218 and the resulting output is passed to data input 228 of latch 220.

Test Enable signal TE is then unasserted, causing the circuit shown in FIG. 2 to go into normal mode. In normal mode, latch control element 242 passes the external Set Direct and Clear Direct signals received on inputs 250 and 248 directly to outputs 254 and 252. Since it is desired to pass the output from logic block 218 to test point 230, the logic generating the external Set Direct and Clear Direct signals will not assert either one. Thus, on the next edge of clock signal CLK, the data present on input 228 will be latched to the output of latch 220 for observation at test point 230.

Figure 3:
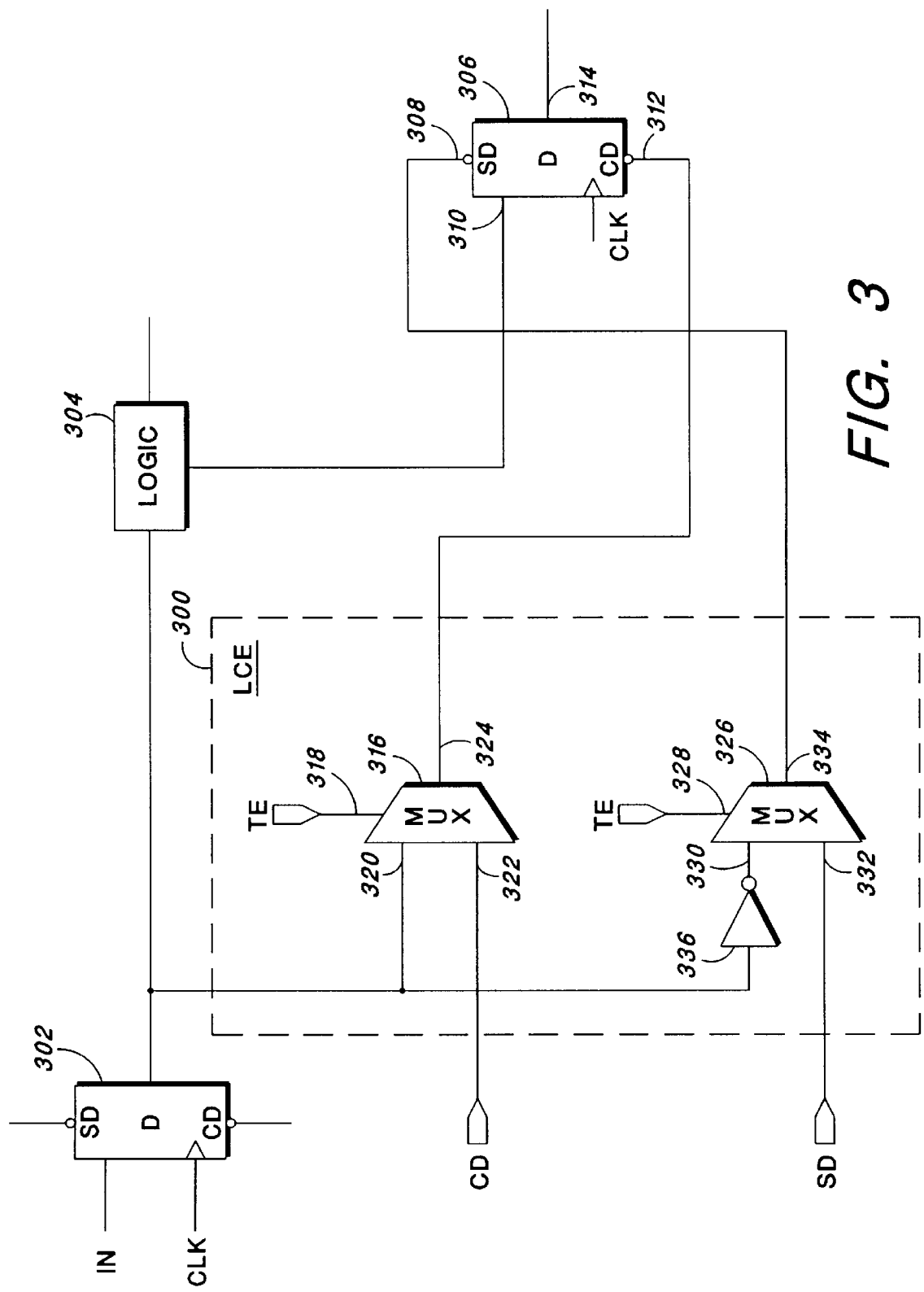
FIG. 3 is a schematic diagram of a latch control element according to an embodiment of the invention.

FIG. 3 is a block diagram of a simplified latch control element 300 according to an embodiment of the invention. An unclocked version of the latch control element is illustrated so as not to obscure important features of the present invention. Numerous variations of this circuit will, of course, occur to those of skill in the art, including versions having suitable clock circuitry. As illustrated, the latch control element 300 is coupled to the output of an upstream "D" latch 302 and the Set Direct and Clear Direct inputs 308 and 312, of a downstream latch 306. The arrangement of latches 302 and 306, latch control element 300 and logic block 304 is substantially as shown in FIG. 2.

Latch control element 300 comprises the multiplexers 316 and 326. Multiplexer 316 is a conventional 2–1 multiplexer and has input 318 for receiving the Test Enable signal TE. The Test Enable signal operates as a multiplexer select line to determine which of the signals received at inputs 320 and 322 are passed to output 324 of the multiplexer. Input 320 is coupled to the output of latch 302. Input 322 receives the external Clear Direct CD signal. When the Test Enable signal TE is asserted, multiplexer 316 selects the data on input 320 for output.

In test mode, multiplexer 316 effectively causes the state of the output of latch 302 to be reflected at output 314 of latch 306, if the output of latch 302 is low. More specifically, if Test Enable signal TE is asserted, multiplexer 316 selects input 320 for output. If the data present at input 320 is low, then output 324 is pulled low which asserts Clear Direct input 308 of latch 306. This overrides any data received from logic block 304 at data input 310 and causes output 314 to go low. Conversely, if the output of latch 302 is high, then in test mode, this high value is output at 324, but does not assert input 308. In normal mode, Test Enable signal TE is low, causing multiplexer 316 to pass the data received at input 322 from the Clear Direct CD signal directly to the Clear Direct input 308 of latch 306. Thus, in normal mode, the latch control element 300 is transparent to the external Clear Direct logic which directly controls operation of latch 308.

The operation of multiplexer 326 is substantially similar to that of multiplexer 316, but operates to control the Set Direct input 312 of latch 306. In this case, inverter 336 has been coupled between the output of latch 302 and input 330 of multiplexer 326. Thus, when the output data of latch 302 is high, the input 330 of multiplexer 326 is low, and, in test mode, the output 334 is low. This asserts Set Direct input 312 of latch 306 causing output 314 to go high, regardless of the data present at input 310. Conversely, if the output of latch 302 is low, then the input 312 of latch 306 is high, i.e., unasserted.

Figure 4:
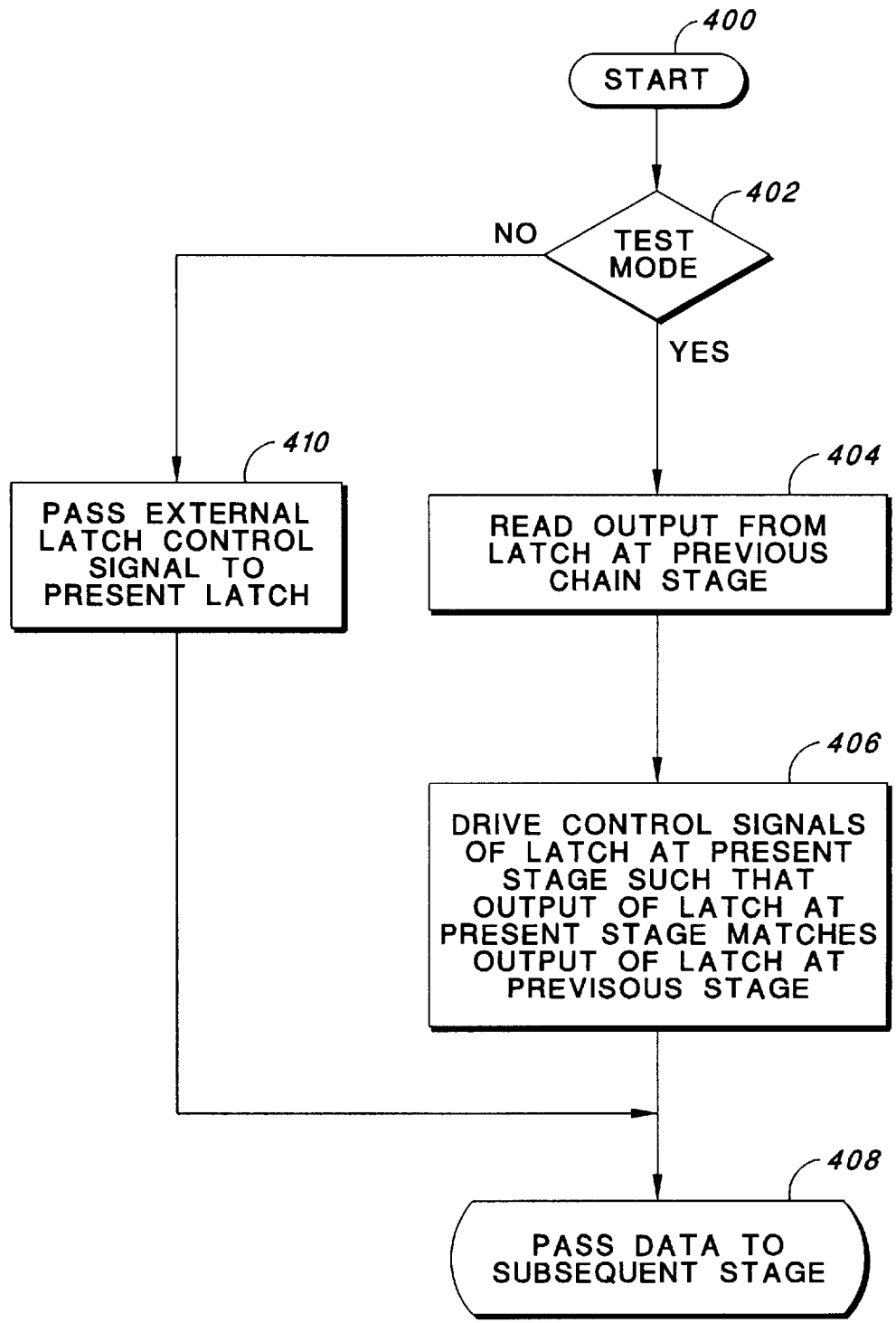
FIG. 4 is a flow chart illustrating the operation of a single stage of the scan chain.

In other embodiments, the invention relates to a method for operating a scan chain fabricated on a semiconductor device. FIG. 4 is a flow chart illustrating the operation of a single stage of the scan chain. The operating stage is referred to as the "present" stage and the stage immediately upstream is referred to as the "previous" stage and the stage immediately downstream of the present stage is referred to as the "subsequent" stage. Each stage comprises functional logic, latches and latch control elements similar to those described earlier. In step 400, the circuit components are initialized as necessary. For example, depending on the circuit design, it may be necessary to reset latches, precharge circuit nodes, etc. In step 402, the circuit determines whether it is in test mode. As discussed earlier, this is generally performed by testing the state of an external Test Enable signal which is globally provided to all stages in the scan chain. However, this is a matter of design choice and variations are possible which use a plurality of signals which place individual stages into test mode at various times in the process.

If the stage is not in test mode, then the external latch control signals, such as Set Direct and Clear Direct, are passed directly to the latch controlled by the stage. This allows the latch to be controlled by external circuitry on the chip, as is common in the art. Again, the latch control signals are typically provided globally by external logic, but in other embodiments, additional logic could be provided for individual stages as a matter of design choice. If the stage is not in test mode, then once the latch control signals are passed, the scan chain passes data from the logic block associated with the present stage to the subsequent stage in step 408.

If the present stage is in test mode, then the method proceeds to step 404 where the output data from the latch of the previous stage is read. The method then proceeds to step 406 where the control signals of the latch at the present stage are driven such that the output data of the latch of the present stage matches the output data of the latch of the previous stage. In other words, if the output of the previous latch is high, then, in one embodiment, the Set Direct signal of the latch of the present stage is driven such that the output of the present latch is also high. When direct control of the latch is taken in step 406, the external latch control signals and the output of the logic block of the present stage are ignored, or overridden. Although this method adds some delay due to the additional capacitive loading of the latch of the previous stage by the circuitry used to read its output in step 404, it will be understood that with careful design, this delay is substantially less than the delay required for the signal to propagate through a multiplexer interposed between the logic block and the latch.

Referring again to FIG. 2, still a further embodiment of the invention is described which provides practical design benefits. In this case, a latch and the corresponding latch control element are combined into one block, or module. For example, block 270 comprises latch 208 and latch control element 232. In practice, the Silicon vendor technology library will contain a scan equivalent block for each register they provide. A customer then designs the appropriate signal path using conventional latches. During scan insertion, it is then only a matter of replacing one block with another and connecting the additional ports on the new module. This simplifies design and shortens the product development time.

The embodiments described herein are illustrative, but not limitative, of the present invention. Other variations in form and detail will occur to those of skill in the art and are within the scope and spirit of the present invention. All patents, patent applications, and other publications discussed herein are hereby incorporated by reference as though set forth in full.

What is claimed is:

1. A method for operating a scan chain on a semiconductor device having a plurality of serially connected logic blocks, an output from a first logic block being coupled to an input of a first latch, an output from the first latch being coupled to an input of a second logic block, and an output of the second logic block being coupled to an input of a second latch, the method comprising:
   detecting a test enable signal;
      detecting the output of the first latch, and
         setting an output of the second latch to the same state as the detected output of the first latch, independently of the state of the output of the second logic block, if the test enable signal is asserted; and
      setting the output of the second latch responsive to the output of the second logic block if the test enable signal is unasserted.

2. A method as in claim 1 further comprising the steps of:
   detecting a latch control signal generated externally to the scan chain; and
   passing the latch control signal to control inputs on the first and second latches if the test enable signal is unasserted.

3. A method as in claim 1 wherein setting an output of the second latch to the same state as the detected output of the first latch comprises:
   generating a latch control signal responsive to the detected output of the first latch; and
   passing the generated latch control signal to a control input on the second latch.

4. An apparatus for operating a scan chain on a semiconductor device having a plurality of serially connected logic blocks, an output from a first logic block being coupled to an input of a first latch, an output from the first latch being coupled to an input of a second logic block, and an output of the second logic block being coupled to an input of a second latch, the apparatus comprising:
   means for detecting a test enable signal;
   means for detecting the output of the first latch;
   means for setting an output of the second latch to the same state as the detected output of the first latch, independently of the state of the output of the second logic block, if the test enable signal is asserted; and
   means for setting the output of the second latch responsive to the output of the second logic block if the test enable signal is unasserted.

5. An apparatus as in claim 4 further comprising:
   means for detecting a latch control signal generated externally to the scan chain; and
   means for passing the latch control signal to control inputs on the first and second latches if the test enable signal is unasserted.

6. An apparatus as in claim 4 wherein the means for setting the output of the second latch to the same state as the detected output of the first latch comprises:
   means for generating a latch control signal responsive to the detected output of the first latch; and
   means for passing the generated latch control signal to a control input on the second latch.

7. A semiconductor device having a scan chain useful to output test data from a plurality of serially connected logic blocks, the scan chain comprising:
   a first logic block having an output coupled to an input of a first latch;
   a second logic block having an output coupled to an input of a second latch and an input coupled to an output of the first latch; and
   a latch control element having an input for detecting a test enable signal, an input for detecting the output of the first latch, and an output for setting an output of the second latch;
   wherein the latch control element sets the output of the second latch to the same state as the detected output of the first latch if the test enable signal is asserted.

8. A semiconductor device as in claim 7 wherein the second latch further comprises set direct and clear direct inputs.

9. A semiconductor device as in claim 8 wherein the latch control element drives one of the set direct or clear direct inputs of the second latch responsive to the output of the first latch if the test enable signal is asserted.

10. A semiconductor device as in claim 9 wherein the latch control element further comprises set direct and clear direct inputs for receiving set direct and clear direct signals generated externally to the scan chain.

11. A semiconductor device as in claim 7 wherein the latch control element passes the received external set direct and clear direct signals to the set direct and clear direct inputs of the second latch if the test enable signal is unasserted.

12. A semiconductor device as in claim 7 wherein the output state of the second latch is responsive to the output state of the second logic block if the test enable signal is unasserted.

* * * * *